(12) United States Patent
Shirai et al.

(10) Patent No.: US 8,216,775 B2
(45) Date of Patent: Jul. 10, 2012

(54) ANTI-REFLECTION FILM FORMING MATERIAL, AND METHOD FOR FORMING RESIST PATTERN USING THE SAME

(75) Inventors: Yuriko Shirai, Kawasaki (JP); Takako Hirosaki, Kawasaki (JP); Masahiro Masujima, Kawasaki (JP); Atsushi Sawano, Kawasaki (JP); Jun Koshiyama, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/385,195

(22) Filed: Apr. 1, 2009

(65) Prior Publication Data

US 2009/0253077 A1 Oct. 8, 2009

(30) Foreign Application Priority Data

Apr. 3, 2008 (JP) ................................. 2008-097146

(51) Int. Cl.
*H01L 21/027* (2006.01)
*G03F 7/11* (2006.01)
*G03F 7/30* (2006.01)

(52) U.S. Cl. ..................... 430/325; 430/273.1; 430/330; 438/952; 524/366

(58) Field of Classification Search ........................ None
See application file for complete search history.

(56) References Cited

U.S. PATENT DOCUMENTS

| | | | |
|---|---|---|---|
| 4,910,122 A | 3/1990 | Arnold et al. | |
| 2003/0180667 A1* | 9/2003 | Takano et al. | 430/311 |
| 2004/0242804 A1* | 12/2004 | Medsker et al. | 525/407 |
| 2007/0160930 A1* | 7/2007 | Wang et al. | 430/270.1 |
| 2007/0224543 A1* | 9/2007 | Griess et al. | 430/302 |

FOREIGN PATENT DOCUMENTS

| | | |
|---|---|---|
| JP | 60-38821 | 2/1985 |
| JP | 3-222409 | 10/1991 |
| JP | 4-55323 | 9/1992 |

OTHER PUBLICATIONS

"Cellulose" Grant et al , ed, Grant & Hackh's Chemical Dictionary, 5th ed., McGraw-Hill Book Company, New York, N.Y. 1987, p. 121.*
Rosenbaum, Dr. Berry, New Technology Offers a Green Light to develop Better Coatings, posted Nov. 1, 2002, 7 pages, downloaded on Sep. 15, 2010 from http://www.pcimag.com/copyright/83b7edee69a7010VgnVCM100000f932a8c0.*
Mansouri et al , Journal of Applied Polymer Science, vol. 106, pp. 1683-1688, year 2007.*
Marren, F.L. 2002, Vinyl Alcohol Polymers. Kirk-Othmer Encyclopedia of Chemical Technology, Pulbished Online : Jun. 10, 2002, copyright John Wiley & Sons, inc, PDF version 34 pages.*

* cited by examiner

*Primary Examiner* — Cynthia Hamilton
(74) *Attorney, Agent, or Firm* — Wenderoth, Lind & Ponack, L.L.P.

(57) ABSTRACT

The anti-reflection film forming material according to the present invention includes (a) a water soluble resin having a vinyl acetate constituent unit, and (b) a compound having a constituent unit represented by the following general formula.

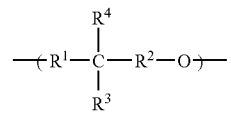

Wherein, $R^1$ and $R^2$ represent a direct bond or a methylene chain; $R^3$ and $R^4$ represent a hydrogen atom, an alkyl group having 1 to 10 carbon atoms, or a group represented by $-(CH_2)_n-O-R^5-R^6$; and at least one of $R^3$ and $R^4$ is a group represented by $-(CH_2)_n-O-R^5-R^6$, wherein: $R^5$ represents a direct bond or an alkylene chain having 1 to 10 carbon atoms which may be interrupted with $-O-$; $R^6$ represents an alkyl group having 1 to 10 carbon atoms in which a portion or all hydrogen atoms are substituted with a fluorine atom; and n represents an integer of 0 to 10. Wherein, the total number of carbon atoms present in $R^1$ and $R^2$ is 1 or 2.

7 Claims, No Drawings

ANTI-REFLECTION FILM FORMING MATERIAL, AND METHOD FOR FORMING RESIST PATTERN USING THE SAME

This application is based on and claims the benefit of priority from Japanese Patent Application No. 2008-097146, filed on 3 Apr. 2008, the content of which is incorporated herein by reference.

BACKGROUND OF THE INVENTION

1. Field of the Invention

The present invention relates to an anti-reflection film forming material for forming an anti-reflection film to be provided on a resist film, and a method for forming a resist pattern using the anti-reflection film forming material.

2. Related Art

Semiconductor wiring substrates are generally formed by laminating a dielectric layer (insulation layer) on a silicon wafer, or the like. A patterned conductive layer (i.e., a wiring layer) is then formed in the dielectric layer to form a semiconductor wiring structure.

The formation of the wiring layer is carried out as follows. First, a conductive layer is formed on a dielectric layer uniformly, and a resist film is formed on this conductive layer. A resist pattern is formed by irradiation (exposure) of a patterning light on this resist film, followed by development, and a wiring layer is formed by patterning of the conductive layer with an etching process using the resist pattern as a mask. Then, after removing the resist film completely, a dielectric layer is further laminated on the conductive layer to configure a wiring layer in the dielectric layer.

It has been conventionally known that a problem referred to as a stationary wave effect due to multiple interference occurs when a pattern is formed by exposing a resist film in the step of forming a wiring layer. That is, an exposed light is transmitted through the resist film, and the transmitted light is reflected on an underlayer surface and a part of the reflected light is further reflected on an upper surface of the resist film, with such event being repeated in the resist film. The interference of an irradiated light at a single wavelength, which has entered the resist film formed on the substrate, with the reflected light from the substrate, and variation of light energy amounts absorbed in a thickness direction of the resist film is generated. This variation affects a size width of the resist pattern obtained after development, resulting in reduction of the dimensional accuracy of the resist pattern.

This reduction in the dimensional accuracy of the resist pattern is of significant concern, particularly when a fine pattern is formed on a substrate having varying levels because the thickness of the resist film becomes inevitably different at the relief structures in portions having such varying levels. Thus, it has been desired to develop a technology in which the above interference effect is eliminated and the dimensional accuracy of the resist pattern is not reduced even in the case of fine patterns formed on a substrate having varying levels.

Consequently, a method in which an anti-reflection film having a property of absorbing the exposed light is formed before forming a resist film on a substrate and a resist film is formed on the anti-reflection film (for example, Patent Document 1, etc.); and a method in which an anti-reflection film constituted with polysiloxane, polyvinyl alcohol or the like is formed on a resist film provided on a substrate (for example, Patent Documents 2 and 3, etc.) have been employed conventionally.

Patent Document 1: U.S. Pat. No. 4,910,122.
Patent Document 2: Japanese Examined Patent Application, Publication No. H4-55323.
Patent Document 3: Japanese Unexamined Patent Application, Publication No. H3-222409.

SUMMARY OF THE INVENTION

However, in the method in which an anti-reflection film is formed on a substrate, mask alignment carried out using a light having the same wavelength as that of the exposure light may be disadvantageous since the detection signal of the mask alignment is attenuated by the anti-reflection film, thereby leading to difficulties in aligning the mask. In addition, it is necessary to transfer the resist pattern to the anti-reflection film with favorable accuracy, and the anti-reflection film must be removed by etching or the like without affecting the substrate following the transfer. Thus, the number of operation steps increases accordingly; therefore, the method cannot always be applied to any substrate processing.

On the other hand, the method of forming an anti-reflection film on a resist film provided on a substrate is suitable for practical use, without need of complicated steps.

However, in such a method in which an anti-reflection film is formed on a resist film provided on a substrate, $C_8F_{17}SO_3H$ (PFOS) is used at present as a fluorochemical surfactant in the anti-reflection film forming material. This substance is problematic in handling since it is a designated chemical substance in Japan, and also is subject to Significant New Use Rule (SNUR) that is a rule related to ecological effects in USA. Specifically, the substance relevant to SNUR can involve taking risks which may impair the health or environment, therefore, wearing of protective equipments in the workplace, and notice, education, training and the like for employees about hazardous properties are required. Furthermore, disposal is also regulated. Therefore, an anti-reflection film forming material which includes in place of $C_8F_{17}SO_3H$ (PFOS) a fluorochemical surfactant that can be easily handled without environmental problems, and exhibits similar effects to those achieved when $C_8F_{17}SO_3H$ (PFOS) is used has been demanded. Moreover, in light of practical advantages, an anti-reflection film forming material which exhibits superior storage stability and is produced without using PFOS is desired.

The present invention was made in view of the foregoing problems, and an object of the invention is to provide an anti-reflection film forming material for use in forming an anti-reflection film on a resist film, the anti-reflection film forming material being easily handled, capable of forming an anti-reflection film having superior optical characteristics similarly to anti-reflection films formed using PFOS, and also being superior in storage stability.

The present inventors found that an anti-reflection film forming material including a certain water soluble resin and a fluorine compound is easily handled, capable of forming an anti-reflection film having superior optical characteristics, and is also superior in storage stability. Accordingly, the present invention was accomplished. Specifically, the present invention provides the following.

The first aspect of the present invention provides an anti-reflection film forming material for forming an anti-reflection film to be provided on a resist film, including (a) a water soluble resin having a vinyl acetate constituent unit, and (b) a compound having a constituent unit represented by the following general formula (1):

(1)

in the above general formula (1), $R^1$ and $R^2$ each represent a direct bond or a methylene chain; $R^3$ and $R^4$ represent a hydrogen atom, an alkyl group having 1 to 10 carbon atoms, or a group represented by —$(CH_2)_n$—O—$R^5$—$R^6$; and at least one of $R^3$ and $R^4$ is a group represented by —$(CH_2)_n$—O—$R^5$—$R^6$, wherein: $R^5$ represents a direct bond or an alkylene chain having 1 to 10 carbon atoms which may be interrupted with —O—; $R^6$ represents an alkyl group having 1 to 10 carbon atoms in which a portion or all hydrogen atoms are substituted with a fluorine atom; and n represents an integer of 0 to 10, and wherein, the total number of carbon atoms present in $R^1$ and $R^2$ is 1 or 2.

The second aspect of the present invention provides a method for forming a resist pattern which includes: forming a resist film on a substrate; forming an anti-reflection film on the resist film using the anti-reflection film forming material of the present invention; selectively irradiating light to the resist film through the anti-reflection film, and carrying out a heat treatment as needed; and removing the anti-reflection film to obtain the resist pattern before subjecting the irradiated resist film to a developing process or during the development process.

By using (a) a water soluble resin having a vinyl acetate constituent unit, and (b) a certain fluorine compound in combination, the anti-reflection film forming material of the present invention is superior in storage stability and can form an anti-reflection film having optical characteristics similarly to anti-reflection films formed using PFOS, without using a substance subject to regulations as described above.

DETAILED DESCRIPTION OF THE INVENTION

Hereinafter, embodiments of the present invention will be explained in detail.
[Anti-Reflection Film Forming Material]

The anti-reflection film forming material of the present invention includes (a) a water soluble resin having a vinyl acetate constituent unit (hereinafter, may be also referred to as "water soluble resin (a)") and (b) a certain fluorine compound described later (hereinafter, may be also referred to as "fluorine compound (b)"). The anti-reflection film forming material of the present invention may further include a surfactant, a nitrogen-containing compound, and an acid compound.
[(a) Water Soluble Resin]

The anti-reflection film forming material of the present invention includes a water soluble resin having a vinyl acetate constituent unit. By combining the water soluble resin having a vinyl acetate constituent unit with a fluorine compound described later, the composition for forming an anti-reflection film that exhibits superior storage stability can be provided. In addition, the anti-reflection film to be formed therewith will have similar optical characteristics to that formed using PFOS. Moreover, this water soluble resin has transmission properties for the irradiated light, and is characterized by: i) being capable of forming a more uniform coating film by a conventional application means such as spin coating; ii) being free from formation of a deteriorated layer in between the resist film even when applied on the resist film; iii) being capable of sufficiently transmitting the active light ray; iv) and being capable of forming an anti-reflection film having a low absorption coefficient and high transparency, and the like. Such characteristics can be improved also by the water soluble resin (a) further including at least one constituent unit selected from the group consisting of a vinyl constituent unit, a cellulosic constituent unit, and an acrylic acid-based constituent unit. The term "constituent unit" referred to herein means a monomer unit of a polymer.

Examples of the constituent unit include vinyl constituent units such as vinyl alcohol constituent units, vinylpyrrolidone constituent units and the like;

cellulosic constituent units derived from hydroxypropylmethylcellulose phthalate, hydroxypropylmethylcellulose acetatephthalate, hydroxypropylmethylcellulose acetatesuccinate, hydroxypropylmethylcellulose hexahydrophthalate, hydroxypropylmethylcellulose, hydroxypropylcellulose, hydroxyethylcellulose, cellulose acetate hexahydrophthalate, carboxymethylcellulose, ethylcellulose, methylcellulose and the like; and acrylic constituent units constituted with N,N-dimethylaminoethyl methacrylate, N,N-diethylaminoethyl methacrylate, N,N-dimethylaminoethyl acrylate, hydroxyethyl acrylate, acrylic acid and the like. The water soluble resin such as copolymers of a vinylpyrrolidone constituent unit/an acrylic acid constituent unit; and polymers of an acrylamide constituent unit/a diacetoneacrylamide constituent unit may be also exemplified. These water soluble resin constituent units may be used alone, or in combination. Among these, highly water soluble constituent units such as vinylpyrrolidone constituent units, and vinyl alcohol constituent units are particularly preferably used.

acrylic acid-based constituent units constituted with polyacrylamide, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloylmorpholine, hydroxyethyl acrylate, acrylic acid and the like.

Among these, highly water soluble constituent units such as vinylpyrrolidone constituent units, and vinyl alcohol constituent units are particularly preferably used.

The vinyl acetate constituent unit present in the water soluble resin (a) is preferably 5% by mole to 60% by mole, more preferably 10% by mole to 50% by mole, and even more preferably 20 to 40% by mole. When the vinyl acetate constituent unit in the water soluble resin (a) accounts for more than 60% by mole, the water solubility of the water soluble resin (a) is likely to be reduced.

The content of the water soluble resin (a) in the anti-reflection film forming material of the present invention is preferably 0.1% by mass to 10% by mass. When the content of the water soluble resin (a) falls within the above range, an anti-reflection film forming material that is superior in storage stability can be provided while keeping favorable coating properties. The aforementioned content is more preferably 0.2% by mass to 2% by mass.

The water soluble resin has a mass average molecular weight of preferably 3,000 to 500,000, and more preferably 5,000 to 200,000. By adjusting the mass-average molecular weight of the water soluble resin to fall within the range described above, the coating properties and coating stability can be improved.
[(b) Fluorine Compound]
(Structure of Fluorine Compound)

The anti-reflection film forming material of the present invention includes (b) a fluorine compound having a constituent unit represented by the following general formula (1):

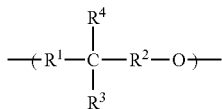

in the above general formula (1), $R^1$ and $R^2$ each represent a direct bond or a methylene chain; $R^3$ and $R^4$ represent a hydrogen atom, an alkyl group having 1 to 10 carbon atoms, or a group represented by $—(CH_2)_n—O—R^5—R^6$; and at least one of $R^3$ and $R^4$ is a group represented by $—(CH_2)_n—O—R^5—R^6$, wherein: $R^5$ represents a direct bond or an alkylene chain having 1 to 10 carbon atoms which may be interrupted with $—O—$; $R^6$ represents an alkyl group having 1 to 10 carbon atoms in which a portion or all hydrogen atoms are substituted with a fluorine atom; and n represents an integer of 0 to 10. Wherein, the total number of carbon atoms present in $R^1$ and $R^2$ is 1 or 2.

Since the fluorine compound (b) has a fluorine atom, the refractive index (n value) and the extinction coefficient (k value) can be kept at a low level in the anti-reflection film including the same. Thus, according to the anti-reflection film forming material of the present invention, formation of an anti-reflection film that is superior in the optical characteristics is enabled.

In addition, the anti-reflection film forming material of the present invention including the fluorine compound (b) has low foaming properties, and thus residual bubbles in the anti-reflection film coated on the resist film can be excluded. Moreover, since the main chain has a polar group, high water solubility may be achieved, and therefore, deposition in the anti-reflection film can be avoided. By virtue of the properties described above, when an anti-reflection film is formed using the anti-reflection film forming material of the present invention, the risk of generating the surface defect and the like can be yet suppressed, and a semiconductor wiring substrate can be efficiently manufactured using the anti-reflection film.

Moreover, the fluorine compound having the constituent unit represented by the above general formula (1) can serve as a film-forming component in an anti-reflection film forming material, and by using the fluorine compound (b) in combination with the water soluble resin (a), improvement of the coating properties and coating stability is enabled.

The fluorine compound (b) is preferably a polymer of a cyclic ether having a fluorinated alkyl group as a side chain, or a copolymer prepared by copolymerization of the cyclic ether having a fluorinated alkyl group with other monomer. As the other monomer, any of cyclic ethers, acrylate, vinyl compounds, silane, siloxane, polyester-forming monomers, polyamide-forming monomers, and polyurethane-forming monomers may be exemplified. In addition, exemplary cyclic ethers having a fluorinated alkyl group as a side chain may include oxetanes and epoxides having the fluorinated alkyl group. When the fluorine compound represented by the above general formula (1) is a copolymer, the copolymer may be either a random copolymer, or a block copolymer.

The fluorine compound (b) preferably has a covalently bound polar group for the purpose of further improving water solubility. Examples of the polar group include: anionic groups such as a carboxyl group, a sulfonic acid group, a sulfuric acid group and a phosphoric acid group; cationic groups such as an amino group, and a phosphino group; and nonionic groups such as a polyether group, a polyethylene oxide group, and a polypropylene oxide group having a degree of polymerization of 1 to 100, and preferably 2 to 25. These polar groups are preferably bound covalently to the end of the fluorine compound (b), but may be present in the main chain of the fluorine compound.

As the fluorine compound including the constituent unit represented by the general formula (1), for example, compounds represented by the following formulae (1a) to (1f), and (1c') and (1d') may be exemplified.

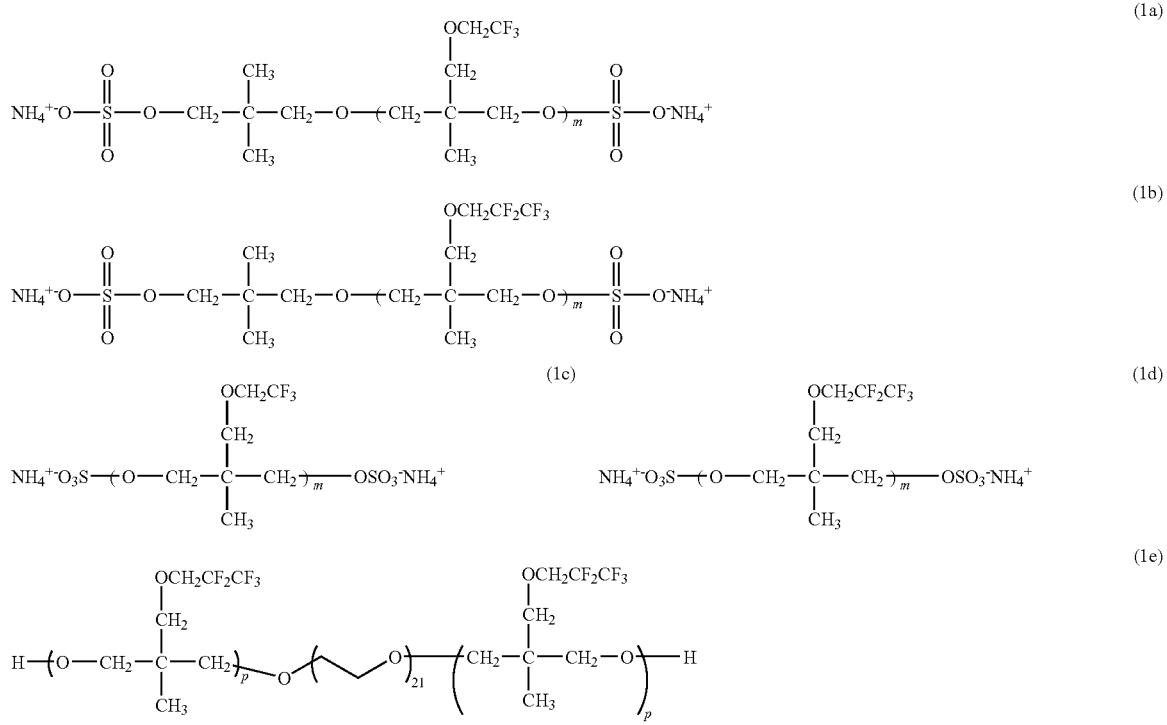

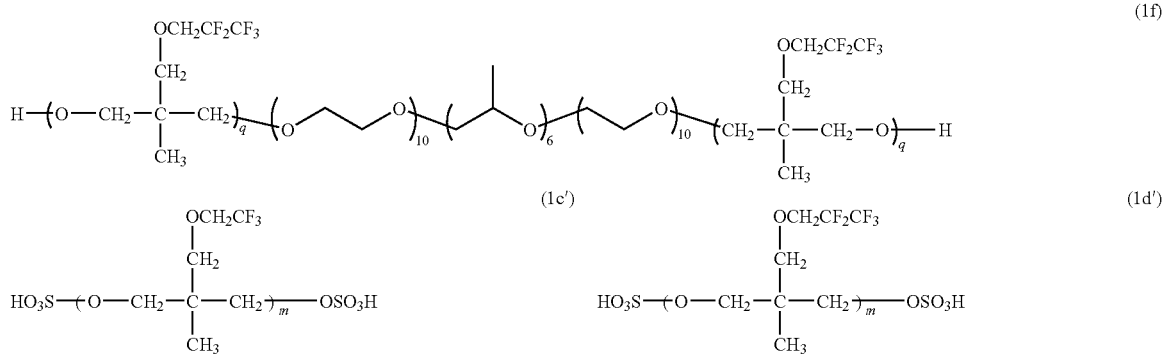

In the above formulae (1a) to (1f), and (1c') and (1d'), m, p, and q represent the degree of polymerization; m represents an integer of 1 to 6; p represents an integer of 1 to 4; and q represents 2 or 3.

The content of the fluorine compound (b) in the anti-reflection film forming material of the present invention is preferably 0.1% by mass to 10% by mass. By adjusting the content of the fluorine compound to fall within the above range, favorable optical characteristics of the anti-reflection film can be maintained. The content of the fluorine compound is preferably 0.2% by mass to 5% by mass, and particularly preferably 0.5% by mass to 3% by mass.

Further, the amount of the water soluble resin having a vinyl acetate constituent unit (a) is preferably 0.1 to 1 part by mass, and more preferably 0.2 to 0.75 parts by mass based on 1 part by mass of the fluorine compound (b). By adjusting the amount to fall within the range described above, a refractive index falling within a preferable range can be achieved.

Although the anti-reflection film forming material of the present invention can include various components described later, the amount of the fluorine compound (b) added to the material is preferably adjusted appropriately such that the solid content in the anti-reflection film forming material accounts for 0.3% by mass to 10% by mass, when such additional components are included.

(Method for Production of Fluorine Compound)

The fluorine compound (b) is obtained by carrying out a polymerization reaction using a cyclic ether represented by the following general formula (2) as one monomer in a conventionally well-known inert solvent. As the inert solvent, hydrocarbon or halogenated hydrocarbon having 1 to 6 carbon atoms may be exemplified, and specific examples include methylene chloride, carbon tetrachloride, trichloromethane, chlorobenzene, dichloroethane, and the like. The polymerization reaction may be carried out in the presence of a boron trifluoride complex such as $BF_3$-ethelate, $BF_3$-THF, and $BF_3$-THPYRAN; phosphorus pentafluoride; antimony pentafluoride; zinc chloride; and a Lewis catalyst such as aluminum bromide, and is preferably carried out in the presence of $BF_3$-THF. As the initiator, a monovalent or bivalent alcohol having 2 to 5 carbon atoms, and including a C—F bond or a C—H bond, or both of these bonds can be used. Specific examples of the alcohol include ethylene glycol, butane-1,4-diol, propylene glycol, isobutane-1,3-diol, pentane-1,5-diol, pentaerythritol, trimethylolpropane, methanol, and the like.

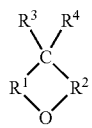

In the above general formula (2), $R^1$ and $R^2$ each represent a direct bond or a methylene chain; $R^3$ and $R^4$ represent a hydrogen atom, an alkyl group having 1 to 10 carbon atoms, or a group represented by —$(CH_2)_n$—O—$R^5$—$R^6$; and at least one of $R^3$ and $R^4$ is a group represented by —$(CH_2)_n$—O—$R^5$—$R^6$, wherein: $R^5$ represents a direct bond or an alkylene chain having 1 to 10 carbon atoms which may be interrupted with —O—; $R^6$ represents an alkyl group having 1 to 10 carbon atoms in which a portion or all hydrogen atoms are substituted with a fluorine atom; and n represents an integer of 0 to 10. Wherein, the total number of carbon atoms present in $R^1$ and $R^2$ is 1 or 2.

[Solvent]

The anti-reflection film forming material of the present invention is generally used in the form of a solution. The solvent which may be predominantly used is water, however, an alcoholic organic solvent may be also added. By adding the alcoholic organic solvent, the solubility of the fluorine compound is improved, whereby uniformity of the coating film can be enhanced. Examples of such an alcoholic organic solvent include isopropyl alcohol, trifluoroalcohol, and the like. It is preferred that the amount of the alcoholic organic solvent added to the anti-reflection film forming material be selected within the range of no greater than 15% by mass of the total mass of the solvent.

[Nitrogen-Containing Compound]

The anti-reflection film forming material of the present invention may further include a nitrogen-containing compound. By including the nitrogen-containing compound, the pH can be adjusted, and favorable storage stability, and matching characteristics with the resist film can be provided. In the anti-reflection film forming material of the present invention, the pH is preferably 1 to 7. When the pH falls within this range, the storage stability of the anti-reflection film forming material can be kept favorably, and the matching characteristics of the anti-reflection film with the resist film can be also kept favorably. The pH is more preferably 1 to 5, and particularly preferably 1 to 3. Examples of suitable nitrogen-containing compound include quaternary ammonium hydroxide, alkanolamine compounds, and amino acid derivatives.

Examples of the quaternary ammonium hydroxide include tetramethylammonium hydroxide, tetraethylammonium hydroxide, tetrapropylammonium hydroxide, tetrabutylammonium hydroxide, methyltripropylammonium hydroxide, methyltributylammonium hydroxide, choline, and the like.

Examples of the alkanolamine compound include 3-amino-1,2-propanediol, 2-amino-1,3-propanediol, triisopropanolamine, mono-, di-, or triethanolamine, amino-2-methyl-1,3-propanediol, and the like.

Examples of the amino acid derivative include glycine, alanine, valine, leucine, isoleucine, proline, phenylalanine, tryptophan, methionine, serine, threonine, cysteine, tyrosine, asparagine, glutamine, aspartic acid, glutamic acid, lysine, arginine, histidine, 4-hydroxyproline, desmosin, γ-aminobutyric acid, β-cyanoalanine, and the like.

The foregoing nitrogen-containing compounds may be used alone, or in combination. Further, these compounds may be used in combination with the acid compound described later. Also, alkanolamine compounds are preferred among these nitrogen-containing compounds, and 3-amino-1,2-propanediol is more preferred.

[Acid Compound]

The anti-reflection film forming material of the present invention may further include an acid compound. The pH can be adjusted by including the acid compound, similarly to the aforementioned nitrogen-containing compound. Examples of suitable acid compound include carboxylic acid-based compounds and sulfonic acid-based compounds.

Examples of the carboxylic acid-based compound include acetic acid, phthalic acid, and the like. Examples of the sulfonic acid-based compound include propanesulfonic acid, ethanesulfonic acid, and the like. These acids may have a substituent such as halogen, and tetrafluorophthalic acid is preferred. These acid compounds may be used alone, or in combination. Furthermore, the aforementioned nitrogen-containing compound may be also used in combination.

[Surfactant]

The anti-reflection film forming material of the present invention may further include a surfactant. Coating properties can be enhanced by incorporating the surfactant. As the surfactant, nonionic surfactants, anionic surfactants, and fluorochemical surfactants are preferred. By including such a surfactant, coating properties, and optical characteristic of the formed anti-reflection film can be further improved.

(Nonionic Surfactant)

Examples of the nonionic surfactant include those represented by the general formula (3):

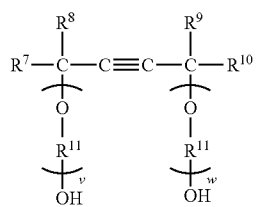

(3)

in the general formula (3), $R^7$ to $R^{10}$ each independently represent a straight or branched alkyl group having 1 to 6 carbon atoms; $R^{11}$ represents a straight or branched alkylene chain having 2 to 4 carbon atoms; and v and w each independently represent an integer of 0 to 30.

Wherein, $R^7$ to $R^{10}$ are preferably a methyl group, an ethyl group, or an isopropyl group. $R^7$ is preferably an ethylene chain, a propylene chain, or a butylene chain. Moreover, v and w are preferably an integer of 0 to 16.

Specific examples of the nonionic surfactant represented by the above general formula (3) include "Surfinol 104 series" and "Surfinol 400 series" manufactured by Air Products and Chemicals, Inc., and the like. Of these, "Surfinol 400 series" is preferred.

(Anionic Surfactant)

Examples of the anionic surfactant include those represented by the general formula (4):

$$R^{12}-SO_3H \tag{4}$$

in the above general formula (4), $R^{12}$ represents a straight or branched alkyl group having 7 to 20 carbon atoms. The alkyl group may have a hydroxyl group and/or a carboxyl group, and may be interrupted by a phenylene group and/or an oxygen atom.

Wherein, $R^{12}$ is preferably a straight or branched alkyl group having 8 to 11 carbon atoms.

Specific examples of the anionic surfactant represented by the general formula (4) include n-octanesulfonic acid, n-nonanesulfonic acid, n-decanesulfonic acid, and n-undecanesulfonic acid. Among these, n-octanesulfonic acid, n-nonanesulfonic acid, and n-decanesulfonic acid are preferred.

The amount of such nonionic and anionic surfactants which may be added is preferably 100 ppm by mass to 10,000 ppm by mass, and more preferably 500 ppm by mass to 5,000 ppm by mass based on the total amount of the anti-reflection film forming material. The coating properties of the anti-reflection film forming material can be improved by adding the nonionic surfactant and the anionic surfactant in an amount within the above range, without generating deposits.

(Fluorochemical Surfactant)

Moreover, the anti-reflection film forming material of the present invention may also include a fluorochemical surfactant for further improving the optical characteristics of the formed anti-reflection film. The fluorochemical surfactant is at least one selected from the compounds represented by the following general formulae (5) to (8).

$$C_rF_{2r+1}COOH \tag{5}$$

$$(C_sF_{2s+1}SO_2)_2NH \tag{6}$$

(7)

(8)

In the above general formulae (5) to (8); r represents an integer of 10 to 15; s represents an integer of 1 to 5; t represents 2 or 3; u represents 2 or 3; $R_f$ represents a hydrogen atom or an alkyl group having 1 to 16 carbon atoms in which a portion or all hydrogen atoms are substituted with a fluorine atom. The alkyl group may have a hydroxyl group, an alkoxyalkyl group, a carboxyl group, or an amino group.

Specifically, as the fluorochemical surfactant represented by the general formula (5), the compound represented by the following formula (5a) is preferred.

$$C_{10}F_{21}COOH \tag{5a}$$

Specifically, as the fluorochemical surfactant represented by the general formula (6), the compound represented by the following formula (6a) or (6b) is preferred.

$$(C_4F_9SO_2)_2NH \quad (6a)$$

$$(C_3F_7SO_2)_2NH \quad (6b)$$

Specifically, as the fluorochemical surfactant represented by the general formula (7), the compound represented by the following formula (7a) is preferred.

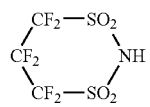

(7a)

Specifically, as the fluorochemical surfactant represented by the general formula (8), the compound represented by the following formula (8a) is preferred.

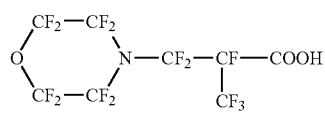

(8a)

When such a fluorochemical surfactant is used, the optical characteristics of the anti-reflection film can be further improved, and favorable film coating performance of the anti-reflection film can be achieved.

The content of the fluorochemical surfactant used in the anti-reflection film forming material is preferably 0.0001% by mass to 10% by mass, and more preferably 0.01% by mass to 3% by mass. When the fluorochemical surfactant is included at a content falling within the above range, an anti-reflection film having further favorable antireflection characteristics and film coating performance can be achieved.

[Method for Forming Resist Pattern]

The method for forming a resist pattern of the present invention is a method which includes: forming a resist film on a substrate; forming an anti-reflection film on the resist film using the anti-reflection film forming material of the present invention; selectively irradiating light to the resist film through the anti-reflection film, and carrying out heat treatment as needed; and removing the anti-reflection film to obtain the resist pattern before subjecting the irradiated resist film to a developing process or during the development process.

[Resist Composition]

The resist composition which can be used in the resist pattern formation method of the present invention is not particularly limited, and can be freely selected from commonly used compositions. Moreover, the resist composition used can be any of positive type and negative type, and one which includes a photosensitive material and a film forming material, and is easily developed with an aqueous alkaline solution may be suitably used, in particular.

Particularly preferable resist compositions are positive and negative resist compositions having a variety of required characteristics which can be adapted satisfactorily for ultrafine processing. Exemplary positive resist compositions may include compositions which contain a quinonediazide photosensitive material and a film forming material. Alternatively, chemically amplified resist compositions may be also exemplified which exhibit increased alkaline solubility due to the catalytic action of the acid generated upon exposure.

The negative resist composition is not particularly limited, and any conventionally known negative resist compositions can be used. The chemically amplified negative resist compositions which have been used as a negative resist composition for fine pattern formation, and including three components, i.e., a crosslinking agent, an acid generator, and a base polymer, can be particularly preferably used.

[Formation of Resist Film and Anti-Reflection Film]

Upon formation of the resist film and the anti-reflection film, the resist composition is first applied on a substrate such as Si, Cu or Au by a spinner process, and the solvent is then volatilized by carrying out heat treatment. Next, the anti-reflection film forming material of the present invention is applied on the resist film by a spinner process, followed by heat treatment to form an anti-reflection film on the resist film. The heat treatment in forming the anti-reflection film is not necessarily a prerequisite, and the heating may not be carried out when only the application yields a favorable coating film that is superior in uniformity.

After the anti-reflection film was formed, an active ray such as ultraviolet ray and far-ultraviolet ray (including excimer laser) is irradiated selectively on the resist film through the anti-reflection film. Thereafter, heat treatment is carried out if necessary, and a developing process is then carried out to form a resist pattern on the substrate.

The anti-reflection film has an optimal film thickness for efficiently reducing the interference effect of the active rays, and this optimal film thickness corresponds to the odd multiple of $\lambda/4n$ (wherein, $\lambda$ represents the wavelength of the active ray employed; and n represents the refractive index of the anti-reflection film). For example, in the case of a anti-reflection film having a refractive index of 1.41, the optimal thickness for each of the active rays will be: the odd multiple of 77 nm for ultraviolet rays (g-rays); the odd multiple of 65 nm for ultraviolet rays (i-rays); and the odd multiple of 44 nm for far-ultraviolet rays (excimer laser), and the thickness of the anti-reflection film preferably falls within the range of each optimal film thickness ±5 nm.

Moreover, formation of this anti-reflection film on a chemically amplified negative or positive resist film is preferred since the effect of improving resist pattern configuration is achieved in addition to the anti-reflective effect. In general, the chemically amplified resists accompanied by deficiency in acid on the resist film surface resulting from the action of organic alkaline vapor such as N-methyl-2-pyrrolidone, ammonia, pyridine or triethylamine present in the ambient air around the manufacture line of semiconductors. Therefore, when a negative resist is employed, the upper extremity of the resist pattern is likely to be rounded, while the resist patterns may be linked to form an eave-like shape when a positive resist is used. The effect of improving resist pattern configuration is to prevent such events, and enabling formation of a rectangular resist pattern configuration. As in the foregoing, the anti-reflection film can be suitably used also as a protective film material of the chemically amplified resist films. In addition, the anti-reflection film leads to favorable film stability similarly to the case in which a fluorochemical surfactant, such as e.g., $C_8F_{17}SO_3H$ (PFOS) is used.

The anti-reflection film may be removed concurrently with the development process of the resist film, but to subject the anti-reflection film to a peeling process prior to the development process is preferred in order to remove it completely. This peeling process can be carried out by completely removing only the anti-reflection film by applying a solvent that dissolves and removes the anti-reflection film while rotating the silicon wafer by a spinner, for example. As the solvent for removing the anti-reflection film, an aqueous solution including a surfactant can be used.

EXAMPLES

Hereinafter, the present invention will be explained in detail by way of Examples. It should be noted that the present invention is not anyhow limited to the following Examples.

Example 1

To 97.2 parts by mass of pure water were added 0.84 parts by mass of a vinylpyrrolidone-vinyl acetate copolymer (vinylpyrrolidone constituent unit: vinyl acetate constituent unit=7:3 (molar ratio), mass average molecular weight: 10,000) as a water soluble resin (a), 1.68 parts by mass of a compound (m=6, manufactured by Omnova Solutions, Inc.) represented by the above formula (1d') as a fluorine compound (b), and 0.05 parts by mass of "Surfinol 420" (manufactured by Air Products and Chemicals, Inc.) as a nonionic surfactant, respectively. To this mixture was added 3-amino-1,2-propanediol, and the pH was adjusted to 2.0, whereby an anti-reflection film forming material was obtained.

Example 2

An anti-reflection film forming material was obtained in a similar manner to Example 1 except that monoethanolamine was used in place of 3-amino-1,2-propanediol.

Example 3

An anti-reflection film forming material was obtained in a similar manner to Example 1 except that a vinyl alcohol-vinyl acetate copolymer (vinyl alcohol constituent unit: vinyl acetate constituent unit=7:3 (molar ratio), mass average molecular weight: 30,000) was used as the water soluble resin (a).

Example 4

An anti-reflection film forming material was obtained in a similar manner to Example 1 except that a vinylpyrrolidone-vinyl acetate copolymer (vinylpyrrolidone constituent unit: vinyl acetate constituent unit=8:2 (molar ratio), mass average molecular weight: 80,000) was used as the water soluble resin (a).

Example 5

An anti-reflection film forming material was obtained in a similar manner to Example 1 except that a 5% by mass aqueous isopropyl alcohol solution was used as the solvent.

Example 6

An anti-reflection film forming material was obtained in a similar manner to Example 1 except that 0.2 parts by mass of tetrafluorophthalic acid was further added, and the pH was thereafter adjusted to 2.0 with 3-amino-1,2-propanediol.

Example 7

An anti-reflection film forming material was obtained in a similar manner to Example 1 except that a compound (m=6, manufactured by Omnova Solutions, Inc.) represented by the above formula (1c') was used as the fluorine compound.

Example 8

An anti-reflection film forming material was obtained in a similar manner to Example 1 except that diethanolamine was used in place of 3-amino-1,2-propanediol.

Example 9

An anti-reflection film forming material was obtained in a similar manner to Example 1 except that triethanolamine was used in place of 3-amino-1,2-propanediol.

Comparative Example 1

An anti-reflection film forming material was obtained in a similar manner to Example 1 except that 0.84 parts by mass of polyhydroxyethyl acrylate (mass average molecular weight: 200,000) was used in place of the water soluble resin (a).

Comparative Example 2

An anti-reflection film forming material was obtained in a similar manner to Example 1 except that 0.84 parts by mass of polyvinylpyrrolidone (mass average molecular weight: 40,000) was used in place of the water soluble resin (a).

[Evaluation of Optical Characteristics]

"TDUR-P3435 (trade name)" (manufactured by Tokyo Ohka Kogyo Co., Ltd.) was coated as a positive resist composition on an 8-inch silicon wafer using a spinner, followed by subjecting to a heat treatment of 90° C. for 60 sec to obtain a resist film having a film thickness of 310 nm. The anti-reflection film forming material obtained in any one of Examples 1 to 9, or Comparative Example 1 or 2 was coated on thus obtained resist film using a spinner, and subjected to a heat treatment of 60° C. for 60 sec. The anti-reflection film had a film thickness of 44 nm.

Using a spectroellipsometer "Wvase32 (product name)" (manufactured by J. A. WOOLLAMJAPAN Corp.), the refractive index (n value) and the extinction coefficient (k value) at 248 nm, 365 nm, and 633 nm were measured on the aforementioned layered products. The results are shown in Table 1.

TABLE 1

| | n value | | | k value | | |
|---|---|---|---|---|---|---|
| | 248 nm | 365 nm | 248 nm | 248 nm | 248 nm | 248 nm |
| Example 1 | 1.44 | 1.4 | 1.39 | 0 | 0 | 0 |
| Example 2 | 1.44 | 1.4 | 1.39 | 0 | 0 | 0 |
| Example 3 | 1.44 | 1.4 | 1.4 | 0 | 0 | 0 |
| Example 4 | 1.47 | 1.43 | 1.41 | 0 | 0 | 0 |
| Example 5 | 1.44 | 1.4 | 1.39 | 0 | 0 | 0 |
| Example 6 | 1.44 | 1.4 | 1.39 | 0 | 0 | 0 |
| Example 7 | 1.44 | 1.4 | 1.39 | 0 | 0 | 0 |
| Example 8 | 1.44 | 1.4 | 1.39 | 0 | 0 | 0 |
| Example 9 | 1.44 | 1.4 | 1.39 | 0 | 0 | 0 |
| Comparative Example 1 | 1.49 | 1.45 | 1.41 | 0 | 0 | 0 |
| Comparative Example 2 | 1.49 | 1.45 | 1.41 | 0 | 0 | 0 |

From Table 1, it was revealed that the layered products obtained using the anti-reflection film forming materials of Examples 1 to 9 exhibited the refractive index and the extinction coefficient at the same levels as those of the layered product obtained using the anti-reflection film forming material prepared with PFOS (Comparative Example 3).

[Evaluation of Storage Stability]

The particle size distribution in the anti-reflection film forming materials prepared according to Examples 1 to 9, and Comparative Examples 1 and 2 was determined using a liquid-particle counter (manufactured by Rion Co., Ltd., product name: Particle Sensor KS-41) immediately after the preparation and following storage at room temperature for one month. The results are shown in Table 2.

TABLE 2

|  | Initial (number of particles) | | One month later (number of particles) | |
| --- | --- | --- | --- | --- |
|  | 0.2 μm or greater | 0.3 μm or greater | 0.2 μm or greater | 0.3 μm or greater |
| Example 1 | 10 | 5 | 12 | 7 |
| Example 2 | 8 | 2 | 10 | 3 |
| Example 3 | 13 | 4 | 19 | 7 |
| Example 4 | 5 | 1 | 7 | 2 |
| Example 5 | 6 | 1 | 9 | 2 |
| Example 6 | 14 | 5 | 24 | 12 |
| Example 7 | 11 | 2 | 11 | 3 |
| Example 8 | 10 | 4 | 11 | 5 |
| Example 9 | 7 | 2 | 9 | 3 |
| Comparative Example 1 | 32 | 12 | 50 | 30 |
| Comparative Example 2 | 44 | 23 | 55 | 36 |

It was revealed from Table 2 that the anti-reflection film forming materials prepared in Examples 1 to 9 yielded lower numbers of both particles having a diameter of no less than 0.2 μm and particles having a diameter of no less than 0.3 μm when prepared, as compared with those prepared in Comparative Examples 1 and 2. In addition, a marked increase in the numbers of both the particles having a diameter of no less than 0.2 μm and the particles having a diameter of no less than 0.3 μm was not observed in the anti-reflection film forming materials prepared in Examples 1 to 9 even after the lapse of one month. In contrast, the numbers of both the particles having a diameter of no less than 0.2 μm and the particles having a diameter of no less than 0.3 μm significantly increased in the anti-reflection film forming materials prepared in Comparative Examples 1 and 2 after the lapse of one month. Therefore, it was proven that the anti-reflection film forming material according to the present invention not only has a desired refractive index and extinction coefficient, but exhibits superior storage stability.

What is claimed is:

1. An anti-reflection film forming material for forming an anti-reflection film to be provided on a resist film, the material comprising:

(a) a water soluble resin comprising a vinyl acetate constituent unit represented by the following formula:

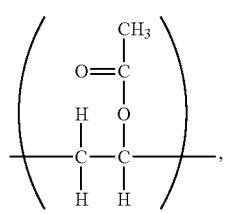

and at least one constituent unit selected from the group consisting of a vinylpyrrolidone constituent unit represented by the following formula:

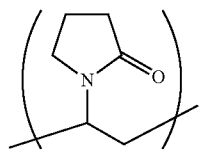

and an acrylic acid-based constituent unit, wherein the acrylic acid-based constituent unit is derived from at least one monomer selected from the group consisting of N,N-dimethylaminoethyl methacrylate represented by the following formula

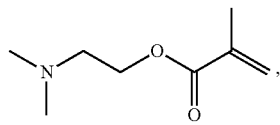

N,N-diethylaminoethyl methacrylate represented by the following formula

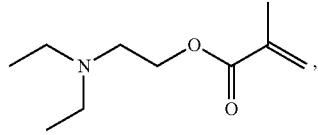

N,N-dimethylaminoethyl acrylate represented by the following formula

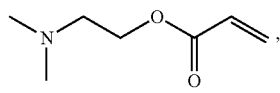

hydroxyethyl acrylate represented by the following formula

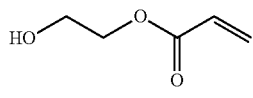

and acrylic acid represented by the following formula

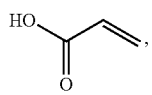

(b) a fluorine compound having a constituent unit represented by the following general formula (1):

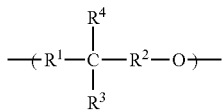 (1)

in the above general formula (1), $R^1$ and $R^2$ each represent a direct bond or a methylene chain; $R^3$ and $R^4$ represent a hydrogen atom, an alkyl group having 1 to 10 carbon atoms, or a group represented by $-(CH_2)_n-O-R^5-R^6$; and at least one of $R^3$ and $R^4$ is a group represented by $-(CH_2)_n-O-R^5-R^6$, wherein: $R^5$ represents a direct bond or an alkylene chain having 1 to 10 carbon atoms which may be interrupted with $-O-$; $R^6$ represents an alkyl group having 1 to 10 carbon atoms in which a portion or all hydrogen atoms are substituted with a fluorine atom; and n represents an integer of 0 to 10, and wherein, the total number of carbon atoms present in $R^1$ and $R^2$ is 1 or 2, and (c) a nitrogen-containing compound.

2. The anti-reflection film forming material according to claim 1, wherein the water soluble resin (a) is included in an amount of 0.1% by mass to 10% by mass.

3. The anti-reflection film forming material according to claim 1, wherein the water soluble resin (a) has a mass average molecular weight of 3,000 to 500,000.

4. The anti-reflection film forming material according to claim 1, wherein the component (b) is included in an amount of 0.1% by mass to 10% by mass.

5. The anti-reflection film forming material according to claim 1 further comprising water.

6. The anti-reflection film forming material according to claim 1, wherein the nitrogen-containing compound (c) is at least one compound selected from the group consisting of a quaternary ammonium hydroxide, an alkanolamine compound, and an amino acid derivative.

7. A method for obtaining a resist pattern comprising:
forming a resist film on a substrate;
forming an anti-reflection film on the resist film using the anti-reflection film forming material according to claim 1;
selectively irradiating light to the resist film through the anti-reflection film, optionally carrying out heat treatment; and
subjecting the irradiated resist film to a developing process to obtain the resist pattern, after removing or while removing the anti-reflection film.

* * * * *